United States Patent
Sambandan et al.

(10) Patent No.: US 8,158,465 B2
(45) Date of Patent: Apr. 17, 2012

(54) VERTICAL COFFEE-STAIN METHOD FOR FORMING SELF-ORGANIZED LINE STRUCTURES

(75) Inventors: Sanjiv Sambandan, Palo Alto, CA (US); Robert A. Street, Palo Alto, CA (US); Ana Claudia Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 136 days.

(21) Appl. No.: 12/484,992

(22) Filed: Jun. 15, 2009

(65) Prior Publication Data

US 2010/0317159 A1    Dec. 16, 2010

(51) Int. Cl.
*H01L 21/336*    (2006.01)

(52) U.S. Cl. .......... 438/149; 438/99; 438/750; 438/765; 438/779; 257/E21.411; 257/E21.017; 257/E21.269

(58) Field of Classification Search .................... 438/99, 438/149, 750, 758, 765, 779; 427/98.4, 197, 427/372.2, 383.7; 257/E21.015, E21.017, 257/E21.018, E21.021, E21.411
See application file for complete search history.

(56) References Cited

U.S. PATENT DOCUMENTS

| | | |
|---|---|---|
| 7,331,218 B2 | 2/2008 | Trainoff |
| 7,776,709 B2 | 8/2010 | Colburn et al. |
| 2004/0263739 A1* | 12/2004 | Sirringhaus et al. .......... 349/135 |
| 2009/0047423 A1 | 2/2009 | Robinson |

OTHER PUBLICATIONS

Deegan et al.: "Contact Line Deposits in an Evaporating Drop", Physical Review E, vol. 62, No. 1, Jul. 2000, pp. 756-765.

* cited by examiner

*Primary Examiner* — Hsien Ming Lee
*Assistant Examiner* — Walter H Swanson
(74) *Attorney, Agent, or Firm* — Bever, Hoffman & Harms, LLP; Patrick T. Bever

(57) ABSTRACT

A "vertical" coffee-stain method for producing self-organized line structures and other very fine features that involves disposing a target structure in a solution made up of a fine particle solute dispersed in a liquid solvent such that a "waterline" is formed by the upper (liquid/air) surface of the solution on a targeted linear surface region of the substrate. The solvent is then caused to evaporate at a predetermined rate such that a portion of the solute forms a self-organized "coffee-stain" line structure on the straight-line portion of the substrate surface contacted by the receding waterline. The substrate and staining solution are selected such that the liquid solvent has a stronger attraction to the substrate surface than to itself to produce the required pinning and upward curving waterline. The target structure is optionally periodically raised to generate parallel lines that are subsequently processed to form, e.g., TFTs for large-area electronic devices.

20 Claims, 10 Drawing Sheets

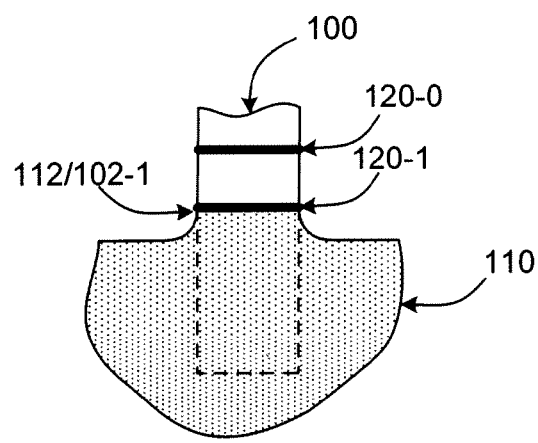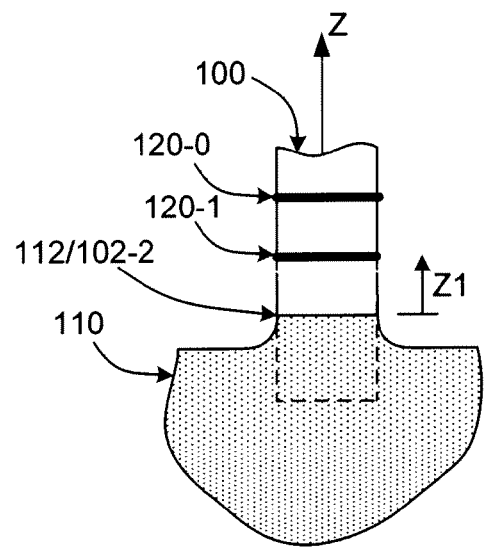
FIG. 4(A)
FIG. 4(B)
lift
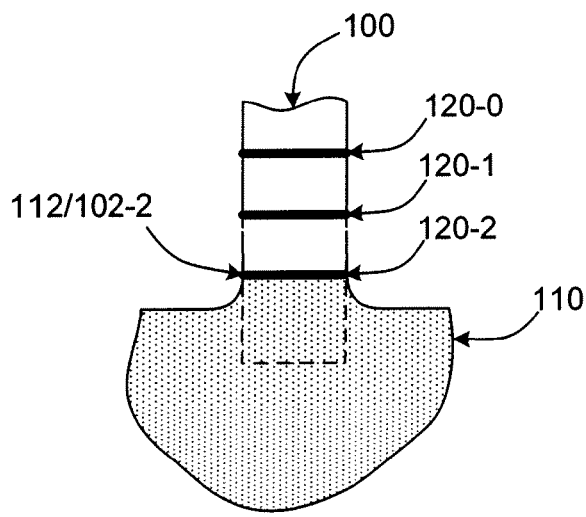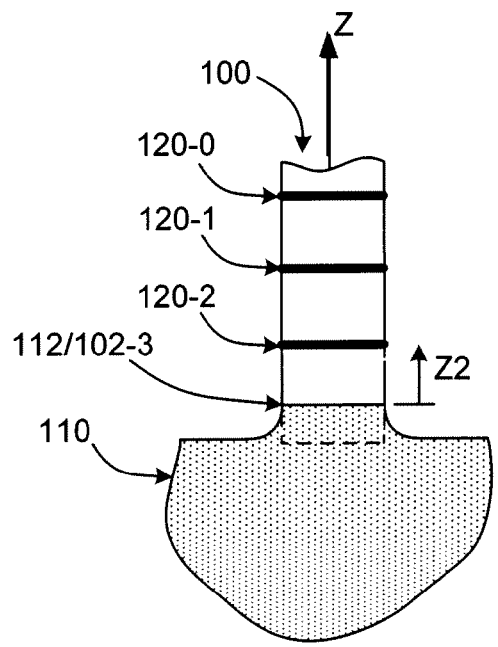
FIG. 4(C)
FIG. 4(D)

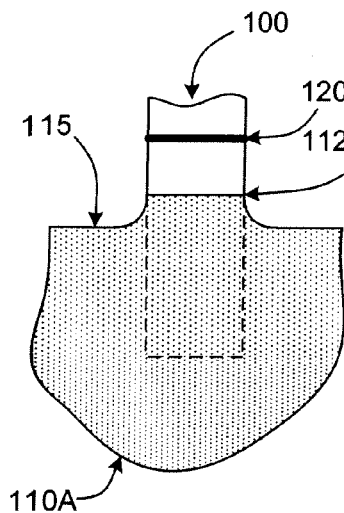
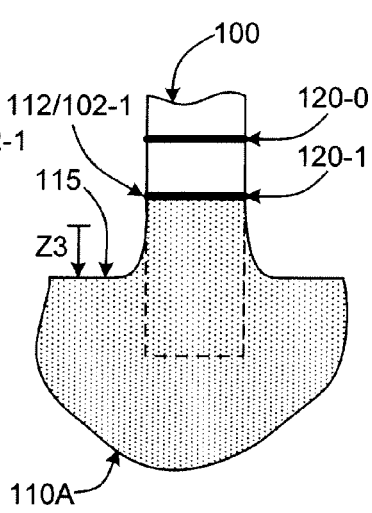
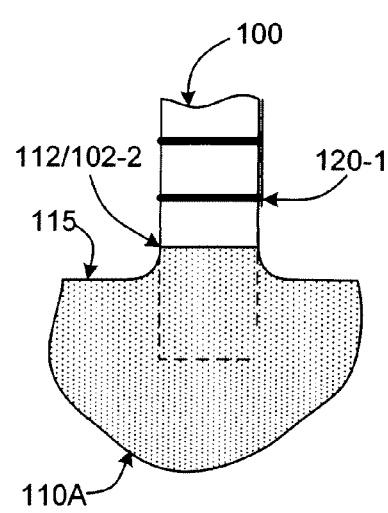
FIG. 5(A)     FIG. 5(B)     FIG. 5(C)
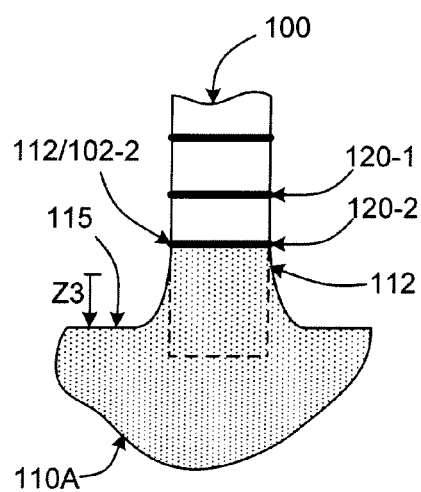
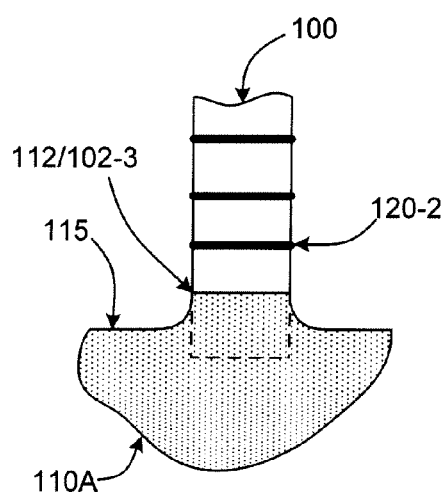
FIG. 5(D)     FIG. 5(E)

VERTICAL COFFEE-STAIN METHOD FOR FORMING SELF-ORGANIZED LINE STRUCTURES

FIELD OF THE INVENTION

This invention relates to large-area electronics and other technologies requiring very fine line structures, and more particularly to methods for producing such closely-spaced, very fine line structures on planar and non planar surfaces.

BACKGROUND OF THE INVENTION

Large-area electronic devices, such as flat panel displays, sensor arrays, and space antennas, typically include large-area sensor or light-emitting electronic cells that are addressed and/or controlled by thin film transistors (TFTs) and other electrical and electronic devices (e.g., passives and photodiodes). Such large-area electronic devices are expensive to make by conventional photolithography techniques due to the relatively large size of the electronic cell arrays (e.g., 1000 $cm^2$ or larger), and the relatively large spacing between adjacent TFTs. Conventional photolithography equipment for fabricating typical (i.e., approximately 300 $cm^2$ or smaller) IC devices is typically constructed to receive and process a semiconductor wafer having a predetermined size, and such wafers are typically much smaller than the substrate of a large-area electronic device. Therefore, specialized equipment for photolithography on large-area substrates must be developed typically at great expense. Moreover, conventional photolithography equipment includes optical and other processing tools that are constructed to facilitate the formation of substantially smaller feature sizes than those required in many elements of large-area electronic devices, thereby making the production of large-area electronic devices using such photolithography equipment highly inefficient.

Polymer semiconductor based field effect transistors are of particular interest for large-area electric device applications such as printed electronics on flexible substrates. However, the typical semiconductors used to make conventional polymer semiconductor based field effect transistors have low mobility (typically 0.001 $cm^2/Vs$ to 1 $cm^2/Vs$). Therefore, the poor transconductance of these devices is a bottleneck for any application. One possible means to improve the transconductance is to improve the aspect ratio (channel width to channel length) of the transistor. However, improving the aspect ratio comes at the cost of layout area and feature size. Therefore, there appears a need for fine feature patterning of electrodes. While lithography can achieve fine features, it eliminates the possibility of low cost, roll to roll electronics which is the advantage of polymer electronics.

Jet-printing, offset printing and other printing techniques represent emerging technologies that attempt to reduce the costs associated with IC production for large-area electronic devices by replacing expensive photolithographic processing with simple printing operations, for example, in which layer structures are formed using nanoparticles and other materials in a solution that is ejected from a print head. By printing an IC pattern directly on a device substrate rather than using the delicate and time-consuming lithography processes used in conventional IC manufacturing, a jet-printing system can significantly reduce IC production costs. The printed IC pattern can either comprise actual IC features (i.e., elements that will be incorporated into the final IC, such as the gates and source and drain regions of TFTs, signal lines, the semiconductor, opto-electronic components, etc.), or it can be a mask printed onto the substrate that is used for subsequent semiconductor processing steps (e.g., etch, implant, etc.).

A problem with conventional jet-printing and other printing techniques is that the feature size (e.g., the width of each printed line) of printed structures is larger than desired in some large-area electronic devices, such as polymer semiconductor based field effect transistors. That is, the feature size of the pattern is limited by the printing technique, and is often much larger than is desired, particularly in the formation of TFTs. A reduction in feature size may be achieved by improving the printing system to pattern finer (smaller) features (e.g., using a smaller nozzle size for a jet-printer). However, most techniques are limited to a feature size of 30 microns or larger, which is often much larger than is desired, particularly in for the TFTs of a large-area electronic device.

Recent studies of the so-called coffee-stain effect have yielded speculation that the concentric lines formed by evaporating drops on horizontal surfaces may prove useful in the production of electronic devices. The phrase "coffee-stain effect" refers to the phenomenon in which solids dispersed in a drying drop will migrate to the edge of the drop and form solid rings. In theory, if the solid dispersed in the solution is conductive (e.g., silver nanoparticles), then the resulting solid "coffee-stain" rings may be used to produce electronic structures. However, due to the inconsistency of the curved or round shape of coffee-stain rings formed by conventional methods, conductive coffee-stain rings would have very limited practical application in the fabrication of electronic devices.

What is needed is a method for producing thin metal lines and other very fine features that may be utilized in the production of large-area electronic devices (e.g., polymer semiconductor based field effect transistors), avoids the problems (e.g., high-cost, low-resolution) associated with conventional techniques such as lithography and conventional printing techniques, and avoids the random patterns produced by conventional coffee-staining techniques.

SUMMARY OF THE INVENTION

The present invention is directed to a vertical coffee-stain method for producing substantially straight, self-organized line structures and other very fine features in a way that avoids the low-resolution and high-cost problems associated with conventional techniques, and avoids the random patterns produced by conventional coffee-staining techniques. The vertical coffee-stain method generally involves disposing a substrate or other target structure in a solution made up of a fine particle solute dispersed in a liquid solvent such that a "waterline" is formed by the upper (liquid/air) surface of the solution on a targeted linear surface region of the substrate. The solvent is then caused to evaporate at a predetermined rate such that a portion of the solute forms a self-organized "coffee-stain" line structure on the straight-line portion of the substrate surface contacted by the receding waterline. That is, instead of using the curved and mostly unpredictable outer boundary (perimeter) of a drying puddle as it recedes in a horizontal direction to form randomly shaped coffee-stain structures using the curved, the vertical coffee-stain method present invention uses the consistently planar upper (liquid/air) surface of a pool or puddle as it recedes in a vertical direction to form straight shaped coffee-stain structures. By utilizing the vertical coffee-stain method of the present invention, the resulting self-organized line structures assumes a predicable, repeatable, substantially straight-line shapes that are more practical than the randomly-shaped "coffee-stain ring" structures produced using conventional receding puddle approaches. For example, as set forth by the various exemplary embodiments set forth below, the present invention facilitates the formation of low-cost, self-organized thin metal lines that may be utilized, for example, to form TFTs and other very fine features during the production of large-area electronic devices, thereby avoiding the low-resolution and high-cost problems associated with conventional techniques such as lithography or printing.

According to an aspect of the invention, the substrate and staining solution utilized during the vertical coffee-stain method are selected such that the liquid solvent has a stronger attraction to the substrate surface than to itself, whereby a resulting balance of forces involving the liquid-air, liquid-solid, and solid-air surface tensions, lead to the upper surface of the solution being pinned to the substrate, and an upward exponentially curving waterline (interface line) forms along the substrate surface that facilitates the formation of the self-organized "coffee-stain" structure. That is, due to the molecular attraction between the solvent and the substrate, the solvent becomes pinned to the substrate along the waterline in a way that forms a wedge-shaped liquid layer where the solvent evaporates at an increased rate. By utilizing a fine particle solute (e.g., silver having an average particle size of 1 micron or less, preferably in the nanoparticle size range), the solute deposits on the substrate at the waterline in a manner similar to that observed at the puddle perimeter in conventional coffee-stain effect studies. In one embodiment, the substrate is the oxide of monocrystalline silicon, the solution consists of a silver nanoparticle ink diluted in de-ionized water, and the rate of evaporation is controlled by adjusting the temperature and atmospheric pressure of the area surrounding the assembly such that the silver nanoparticles form conductive lines on the substrate that have a nominal width of 1 micron.

According to an embodiment of the present invention, the vertical coffee-stain method is repeated to self-organize nanoparticles into nonintersecting curves or parallel lines. In accordance with one specific embodiment, the parallel lines are produced by periodically shifting the substrate upward out of the solution pool/puddle, thereby controlling the distance between adjacent lines. In another embodiment, a regular array of fine lines is printed on the substrate due to a slip-stick phenomenon caused as the surface of the pool/puddle recedes relative to a stationary substrate. In both instances, the resulting parallel lines may be printed with widths as small as one micron and having a spacing of five microns or less, which cannot be achieved using conventional printing techniques.

According to another specific embodiment of the present invention, the parallel lines of conductive nanoparticles are used to produce, e.g., high transconductance transistors for large-area electronic devices. First, the parallel lines formed using the methods described above are sintered so that the deposits of silver nanoparticles define parallel conductive lines. The lines are then isolated by cutting straight the lines into segments using a laser or a comb of soft picks. In one specific embodiment, source and drain contacts are printed onto opposite ends of the lines, and then the contact terminations are cut using, for example, a laser to provide an interdigitated TFT with high width to length ratio. In another specific embodiment, a grid TFT structure is formed by depositing a gate dielectric such as polymer PVP, (or using the oxide of the silicon as the bottom gate dielectric) over the parallel lines, and providing source and drain electrodes that extend parallel to the lines. In yet another embodiment, an impurity (e.g., a gate metal) is intentionally introduced onto the substrate that causes the subsequently formed lines to bend into a desired shape, thereby forming an intended TFT structure. In other embodiments, lines produced in accordance with the vertical coffee-stain method of the present invention are used to form fine capillaries and fluidic channels, electrical bus routes, and templates for small feature stamps without the use of photolithography.

According to another aspect of the invention, line structures are formed over irregular (e.g., non-planar) surfaces such that the line structures rise and fall with the elevation changes of the substrate, yet maintain a straight line from a top-view perspective. Such contiguous line structures are inherently formed using the method of the present invention due to the tendency for the waterline to follow the changing topography when the substrate is tipped on its side and inserted in the solution. This feature may be very useful in the formation of long signal lines disposed over multiple metallization and passivation layers.

BRIEF DESCRIPTION OF THE DRAWINGS

These and other features, aspects and advantages of the present invention will become better understood with regard to the following description, appended claims, and accompanying drawings, where:

FIGS. 4(A), 4(B), 4(C) and 4(D) are partial cross-sectional side views showing the formation of self-organized line structures according to a specific embodiment of the present invention;

FIGS. 5(A), 5(B), 5(C), 5(D) and 5(E) are partial cross-sectional side views showing the formation of self-organized line structures according to another specific embodiment of the present invention;

DETAILED DESCRIPTION OF THE DRAWINGS

The present invention relates to an improved method for forming fine lines of material on target structures, and in particular to the formation of thin, closely spaced metal lines and other fine features on substrates during the production of large-area electronic devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
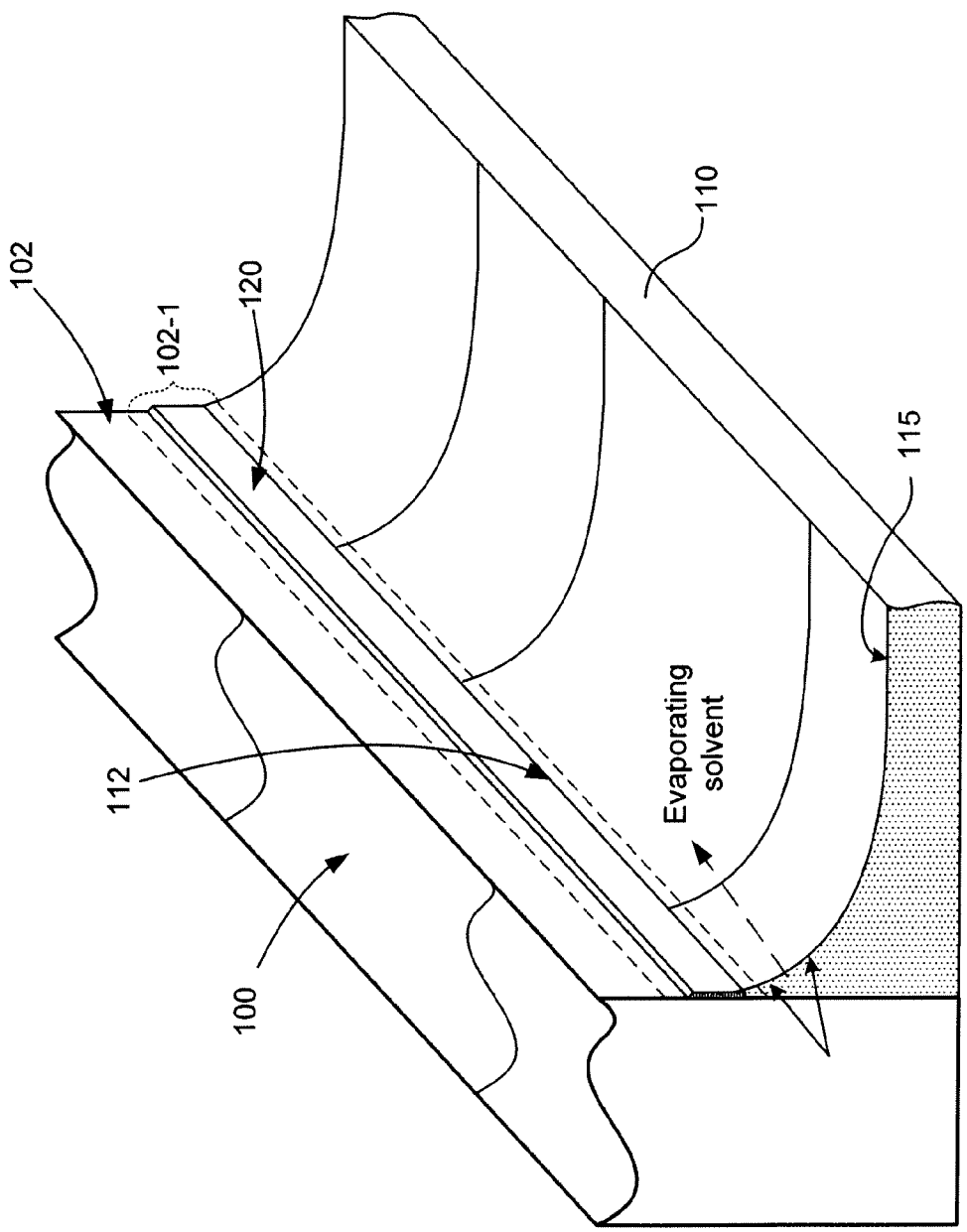
FIG. 1 is a top side partial perspective view showing the formation of a self-organized line according to an embodiment of the present invention.

FIG. 1 is a top side perspective, cutaway view showing a portion of a substrate (target structure) 100 and a quantity of a solution 110 that is disposed in operable contact with a surface 102 of substrate 100 such that an upper surface 115 of solution 110 forms a waterline 112 along a linear surface region 102-1 (designated by dashed lines) of surface 102. The term "waterline" as used herein is intended to denote the linear region defined by the liquid/air/substrate interface formed by upper surface 115 of solution 110, surface 102 of substrate 100 and the gaseous atmosphere (e.g., air) disposed above upper surface 115. "Waterline" is not intended to be limited to liquid water unless otherwise specified. Solution 110 and substrate 100 are preferably maintained in a substantially stable (stagnant) condition such that upper surface 115 is planar and substantially free of ripples. Solution 110 and is disposed in a pool or puddle in accordance with the arrangements described below with reference to FIGS. 2 and 3, respectively.

According to an aspect of the present invention, surface 102 and solution 110 are matched such that solution 110 is pinned to linear surface region 102-1 when solution 110 is disposed in the operable arrangement shown in FIG. 1. In particular, solution 110 includes a solute disposed in a liquid solvent, wherein the solvent is made up of liquid molecules having a stronger attraction to surface 102 than to themselves. Under these conditions, the attraction of the liquid solvent to surface 102 causes waterline 112 to assume an upward curving shape on the linear surface region 102-1 similar to that shown in FIG. 1 (i.e., such that the point at which waterline 112 dies out on surface 102 is vertically higher than planar upper surface 115 disposed away from surface 102, and gradually curves downward from waterline 112 to planar upper surface 115). In an exemplary specific embodiment, surface 102 comprises a hydrophilic material (e.g., oxygen plasma cleaned oxide of silicon), and solution 110 comprises a solute disposed in de-ionized water (solvent). The attraction between the de-ionized water and surface 102, particularly when the parameters discussed below are modified to favor attraction, produces the desired upward-curving waterline 112 shown in FIG. 1.

According to another aspect of the invention, the solute is made up of particles having an average size that is smaller than one micron ($10^{-6}$ m), and preferably is made up of nanoparticles (i.e., particles having an average size in the range of one to 100 nanometers ($10^{-9}$ m)). In a specific example used to produce conductive lines, solution 110 is formed by mixing a 40 uL of 20 W silver (Ag) ink (produced by Cabot Corp. of Boston, Mass., USA) in 20 mL of DI Water. By utilizing silver nanoparticles, the solute were found to deposit on substrate 100 at waterline 112 in a manner similar to that observed on a horizontal surface at a puddle perimeter in conventional coffee-stain effect studies.

Figure 2:
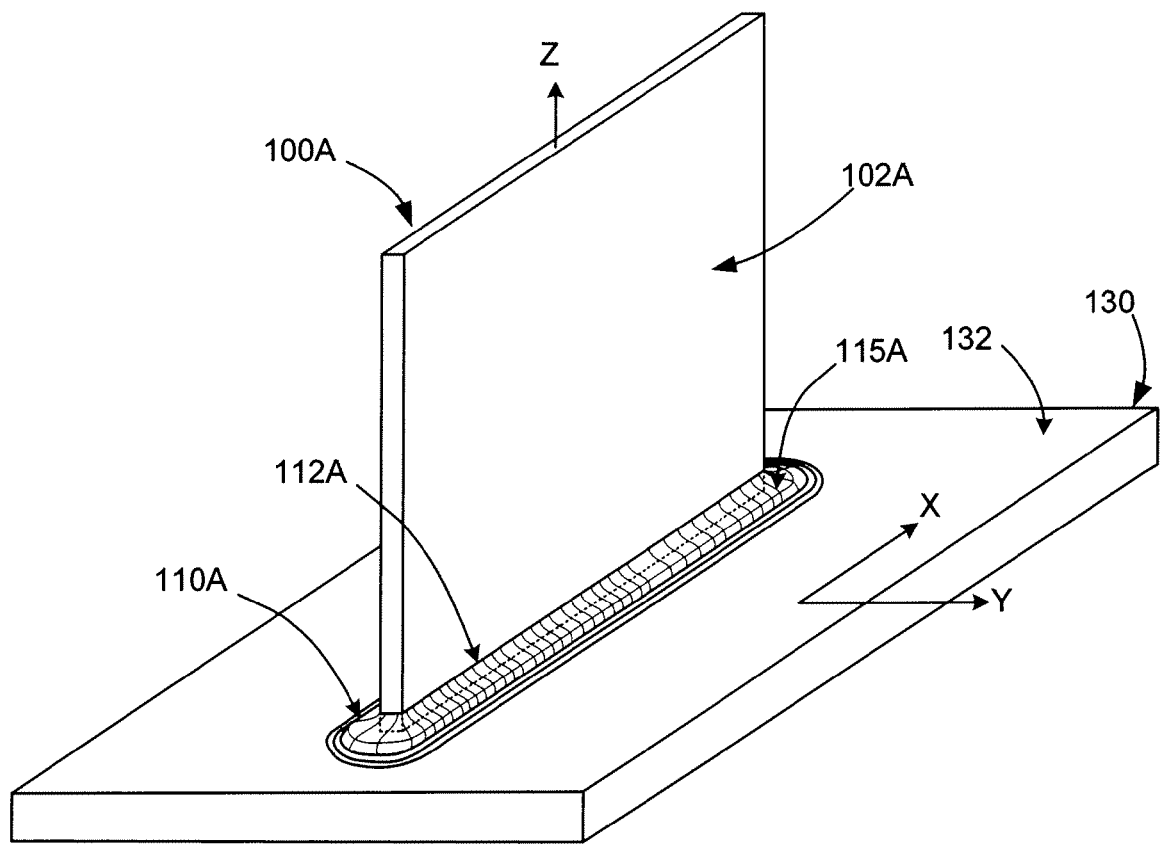
FIG. 2 is a top side partial perspective view showing an exemplary solution puddle arrangement for forming self-organized structures according to a specific embodiment of the present invention.

FIG. 2 is a perspective view showing an arrangement for performing the method of the present invention according to an exemplary embodiment of the present invention. A bath plate 130 is disposed in a horizontal position such that an upper surface 132 of bath plate 130 is disposed in an X-Y plane that is horizontal to earth's gravitational force, which is directed along vertical line parallel to arrow Z. A solution puddle 110A is then formed on horizontal bath plate 130, wherein the composition of solution puddle 110A is selected such that the peripheral boundary of puddle 110A is pinned to bath plate 130. A lower, planar edge of a substrate 100A is then aligned parallel to upper surface 115A of puddle 110A, and then substrate 100A is lowered (or bath plate 130 is lifted) using a precision Z-axis positioning mechanism (e.g., a vernier scale optimal mirror positioner such that the lower edge of substrate 100A is brought into contact with upper surface 115A, whereby puddle 110A wets to substrate 100A in a manner similar to that described above with reference to FIG. 1, and forms a capillary bridge between bath plate 130 and substrate 100A. Although waterline 112A formed by puddle 110A on surface 102A of substrate 100A is close to the lower edge of substrate 100A, waterline 112A is substantially accurately portrayed by waterline 112 in FIG. 1.

Figure 3:
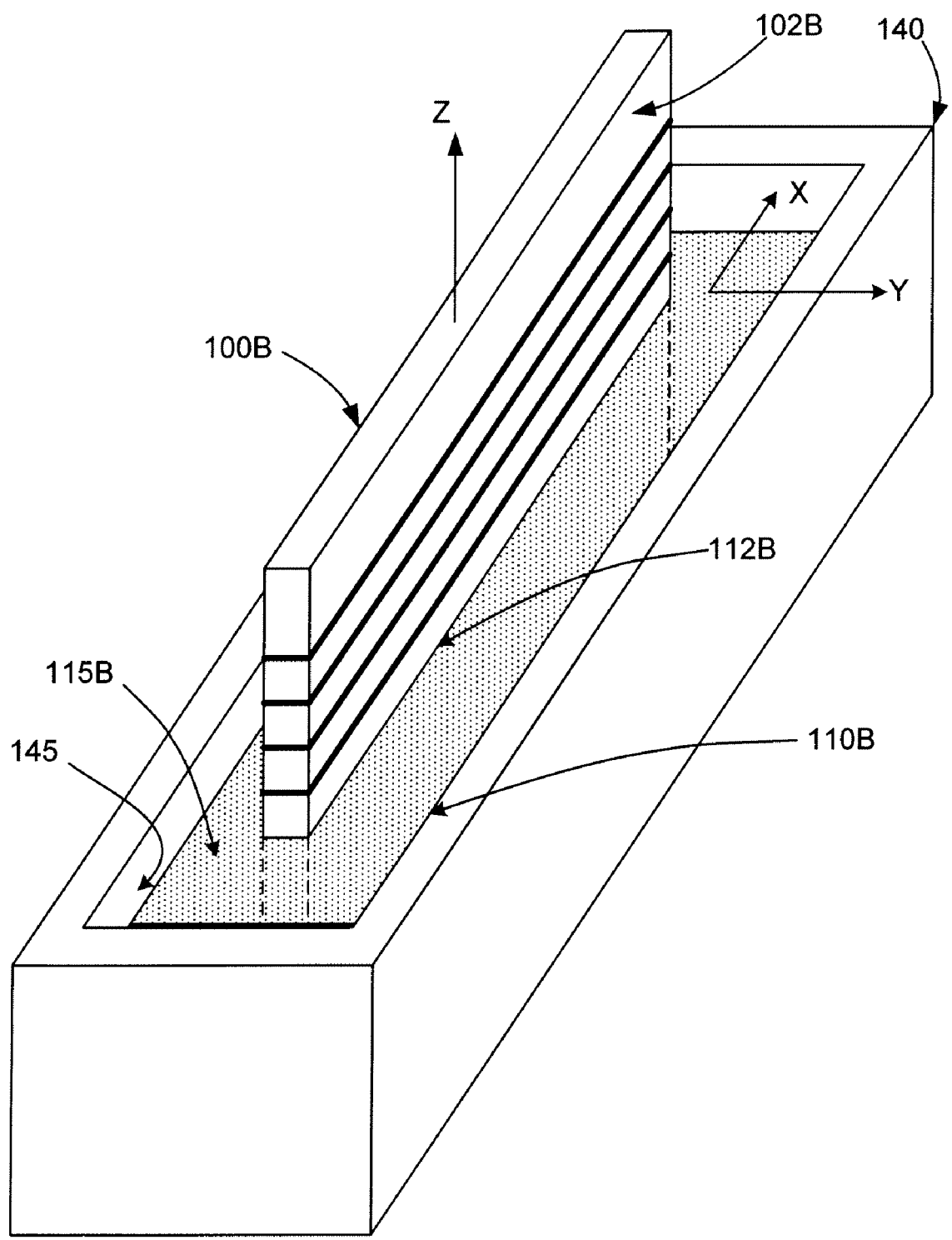
FIG. 3 is a top side partial perspective view showing an exemplary solution pool arrangement for forming self-organized structures according to another specific embodiment of the present invention.

FIG. 3 is a perspective view showing a second arrangement for performing the method of the present invention according to another exemplary embodiment of the present invention. A bowl-like container 140 having an open side 145 surrounded by peripheral walls is disposed such that a solution pool 110B forms an upper surface 115B in the horizontal X-Y plane when solution is inserted therein. The solution of pool 110B is substantially the same as that described above. A lower, planar edge of a substrate 100B is then aligned parallel to upper surface 115B of pool 110B, and then substrate 100B is lowered (or container 140 is lifted) such that the lower edge of substrate 100B is brought into contact with upper surface 115B, whereby pool 110B wets to substrate 100B in a manner similar to that described above with reference to FIG. 1. An advantage of the arrangement shown in FIG. 3 over the arrangement shown in FIG. 2 is that waterline 112B formed by pool 110B on surface 102B of substrate 100B may be formed farther from the lower edge of substrate 100A, thereby facilitating the formation of self-organized structures over a larger surface area than is possible using the arrangement of FIG. 2.

As set forth above, by dipping or otherwise submerging a substrate in a solution of nanoparticles and causing the solvent to evaporate, a straight, self-organized line is patterned on the substrate by way of the vertical coffee-stain method introduced by the present invention. According to another aspect of the invention that is described below, the vertical coffee-stain method also facilitates forming closely-spaced, parallel self-organized lines on the substrate by repeating the line forming process multiple times, for example, by moving (displacing) the substrate at a constant or variable velocity in the Z-axis direction relative to the solution, or by causing the solution surface to recede in the Z-axis direction relative to the substrate.

FIGS. 4(A) to 4(D) are partial edge views showing substrate 100 partially submerged in solution 110, and illustrates a process of slowly withdrawing substrate 100 from solution 110 in order to pattern lines in parallel on the surface of substrate 100. Note that substrate 100 and solution 110 implement one of the arrangements described above with reference to FIGS. 2 and 3. As indicated in FIG. 4(A), the surface tension between solution 110 and substrate 100 generates the upward-curving waterline 112 at a first linear surface region 102-1 in the manner described above. A previously formed self-organized line 120-0 is shown disposed on substrate 100 for reference. In the manner described above, substrate 100 is maintained in the fixed position shown in FIG. 4(A) until a (first) self-organized line 120-1 is formed on substrate 100 at first linear surface region 102-1. Substrate 100 is then moved (displaced) using a precision Z-axis positioning mechanism in the Z-axis direction (indicated in FIG. 4(B)) such that waterline 112 of solution 110 shifts downward along substrate 100 to a second linear surface region 102-2 (i.e., line 120-1 shifts upward by a distance Z1, as shown in FIG. 4(B)). Substrate 100 is again maintained in the fixed position shown in FIG. 4(C) until a (second) self-organized line 120-2 is formed on linear surface region 102-2, which is a distance Z1 below line 120-1. Substrate 100 is then again moved in the Z-axis direction (indicated in FIG. 4(D)) such that waterline 112 of solution 110 shifts downward along substrate 100 to linear surface region 102-3 (i.e., line 120-2 is moved upward by a distance Z2 from waterline 112, as shown in FIG. 4(D)), thus positioning substrate 100 for forming an additional line.

FIGS. 5(A) to 5(E) are partial edge views showing substrate 100 partially submerged in a solution 110A containing a relatively volatile solvent (e.g., water, and illustrates a second process for forming parallel lines utilizing the "slip-stick" characteristic observed in conventional coffee-stain effect studies. That is, the inventors observed that by maintaining substrate 100 in a fixed (Z-axis) position relative to solution 110A, and by causing surface 115 of solution 110A to slowly recede downward along the surface of substrate 100 (i.e., allowing the volatile solvent to evaporate), a "slip-stick" phenomenon occurs by which waterline 112 shifts downward by substantially regular distances. Substrate 100 and solution 110A implement one of the arrangements described above with reference to FIGS. 2 and 3. As indicated in FIG. 5(A), a previously formed self-organized line 120-0 is shown disposed on substrate 100, and waterline 112 is shown at a first linear region 102-1 that is positioned above surface 115 of solution 110A by a small distance. Note that substrate 100 and a vessel (container or control plate) supporting solution 110A are maintained in a fixed relationship. As depicted in FIG. 5(B), under these conditions the inventors observed that waterline 112 becomes pinned ("sticks") to substrate 100 at first linear region 102-1 as a (first) self-organized line 120-1 is formed, even though surface 115 of solution 110A recedes slightly (i.e., the waterline structure becomes elongated by a distance Z3. When the gravitational force on the solution disposed in upward-curving waterline 112 overcomes the attractive forces pinning waterline 112 to substrate 100, waterline 112 becomes detached from first line 120-1 and "slips" (recedes) downward along substrate 100 to second linear surface region 102-2, as illustrated in FIG. 5(C). Once upward-curving waterline 112 is reformed at second linear surface region 102-2, it again "sticks" (becomes pinned), and a second line 120-2 is formed at linear surface region 102-2 (FIG. 5(D)) while solution 110A again evaporates and surface 115 recedes downward by approximately the distance Z3, when again waterline 112 slips to third linear surface region 102-3 (shown in FIG. 5(E)). This "slip-stick" phenomenon was observed to repeat itself multiple times as a solution puddle evaporated.

Figure 6:
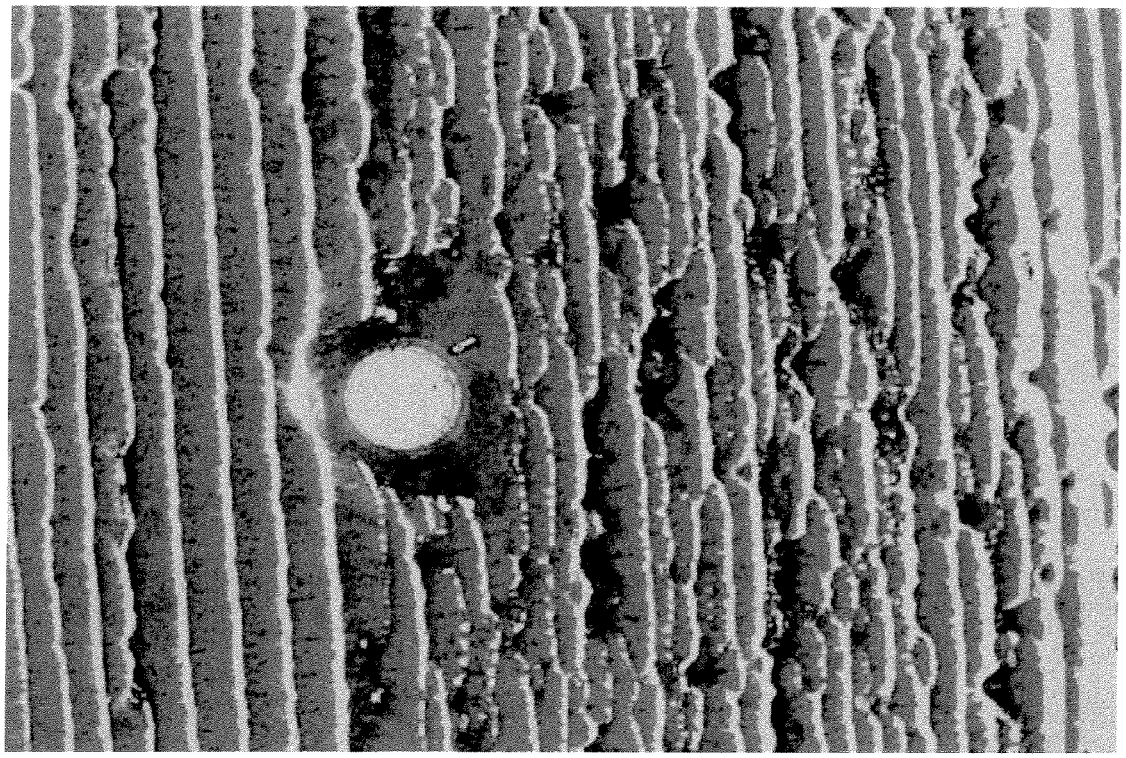
FIG. 6 is a photograph showing exemplary parallel lines formed by the inventors according to the methods of the present invention.

FIG. 6 is an enlarged photograph showing lines formed in accordance with the methods described above. There are some defects, no doubt related to lack of cleanliness of the substrate or solution. The separation of the lines (each of which is about 1 micron) in is about 5 microns (which cannot be achieved using conventional printing techniques). Several important variables were observed that affect the printed pattern. First, the surface tension between the solution and the substrate (which can be controlled by modifying the substrate surface by the deposition of another material either by spin coating or evaporation and the process temperature, which modifies the distance of separation between the patterned lines). Second, in the arrangement shown in FIG. 2, the surface tension between the solution and the bath plate is an important variable, and can also be controlled by modifying the bath plate surface and the process temperature (pinning is essential for line formation, depinning is essential for parallel line formation, thus the solvent must pin to the substrate while the solute must not). The third important variable is temperature, which controls the rate of evaporation, and therefore the rate of solute deposition. The fourth important variable is vapor pressure, which also controls the rate of evaporation. The vapor pressure is indicative of the percentage of solvent in the ambience. If this is high, the rate of evaporation is lower and vice versa. The fifth important variable is the solute—its molecular packing density controls features of the coffee-stain line formation, and must not pin/stick to the bath plate surface with a force greater than the surface tension with the substrate.

According to another embodiment of the present invention, the parallel lines of conductive nanoparticles described above are used to develop solution-process thin-film transistors (TFTs) with short channel length and high transconductance for large-area electronic devices.

Figure 7A:
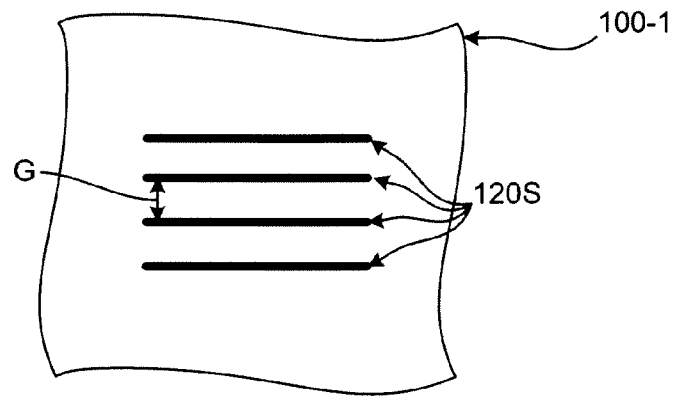
FIGS. 7(A), 7(B) and 7(C) are partial top plan views showing the formation of an interdigitated TFT according to a specific embodiment of the present invention.
Figure 7B:
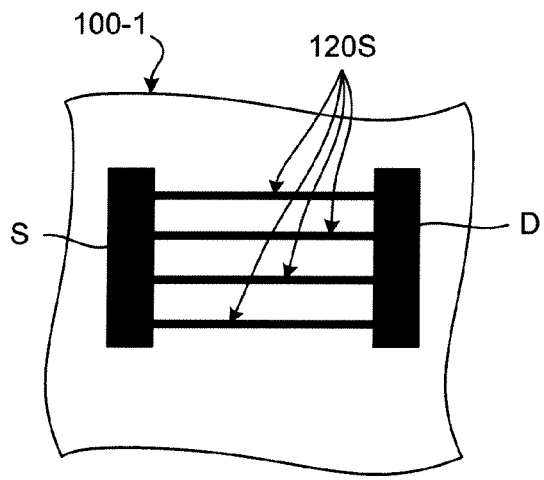
Figure 7C:
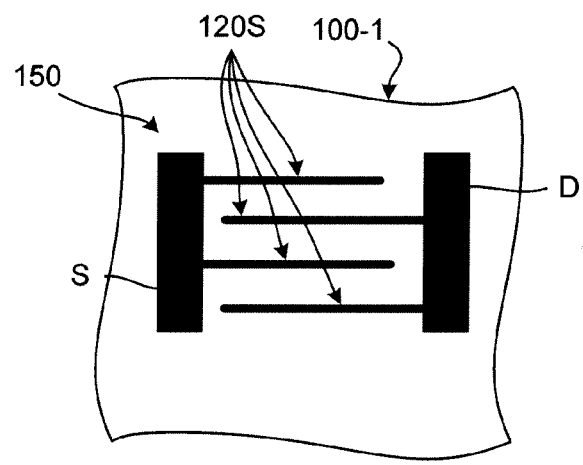

FIGS. 7(A) to 7(C) are simplified partial top views illustrating an exemplary method for utilizing the parallel lines formed on a substrate 100 to form interdigitated source and drain contacts for a TFT 150. First, the parallel lines formed using the methods described above are sintered (e.g., at 150° C. for ten minutes) so that the deposits of silver nanoparticles define parallel conductive lines. The lines are then isolated by cutting the straight lines into segments 120S using a laser or a comb of soft picks (FIG. 7(A)). As shown in FIG. 7(B), source and drain contacts (S and D) are then printed or deposited onto the ends of segments 120S using known techniques (e.g., jet printing), and then contact terminations (gaps) are cut between each segment 120S and one of contacts S and D as shown in FIG. 7(C) by removing portions of segments 120S using, for example, a laser (i.e., by laser ablating the portions), to achieve a high aspect ratio. The resulting interdigitated TFT 150, which has a high width to length ratio, is shown in FIG. 7(C).

Figure 8:
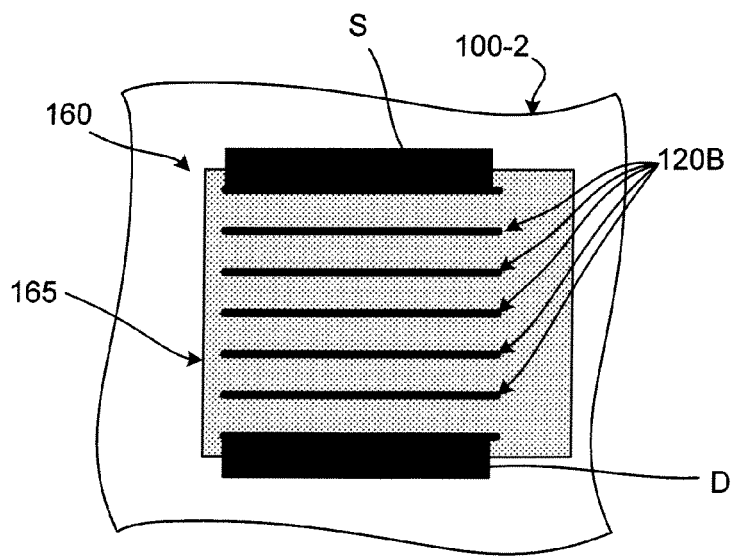
FIG. 8 is a partial top plan view showing a grid TFT formed in accordance with another specific embodiment of the present invention.

FIG. 8 is a simplified partial top view illustrating an exemplary grid TFT 160 formed in accordance with another specific embodiment of the present invention. Grid TFT 160 includes line segments 120B that are formed and patterned in the manner described above, with source and drain electrodes S and D printed/deposited parallel to segments 120B such that several segments 120B are disposed between electrodes S and D. This design uses segments 120B to reduce the effective channel length between source and drain electrodes S and D. Next, a gate dielectric such as polymer PVP 165 is formed over segments 120B that contacts source and drain regions S and D. By utilizing several parallel segments 120B, it does not matter if there are some short-circuit events between adjacent segments 120B; hence, grid TFT 160 is robust against defects.

Figure 9:
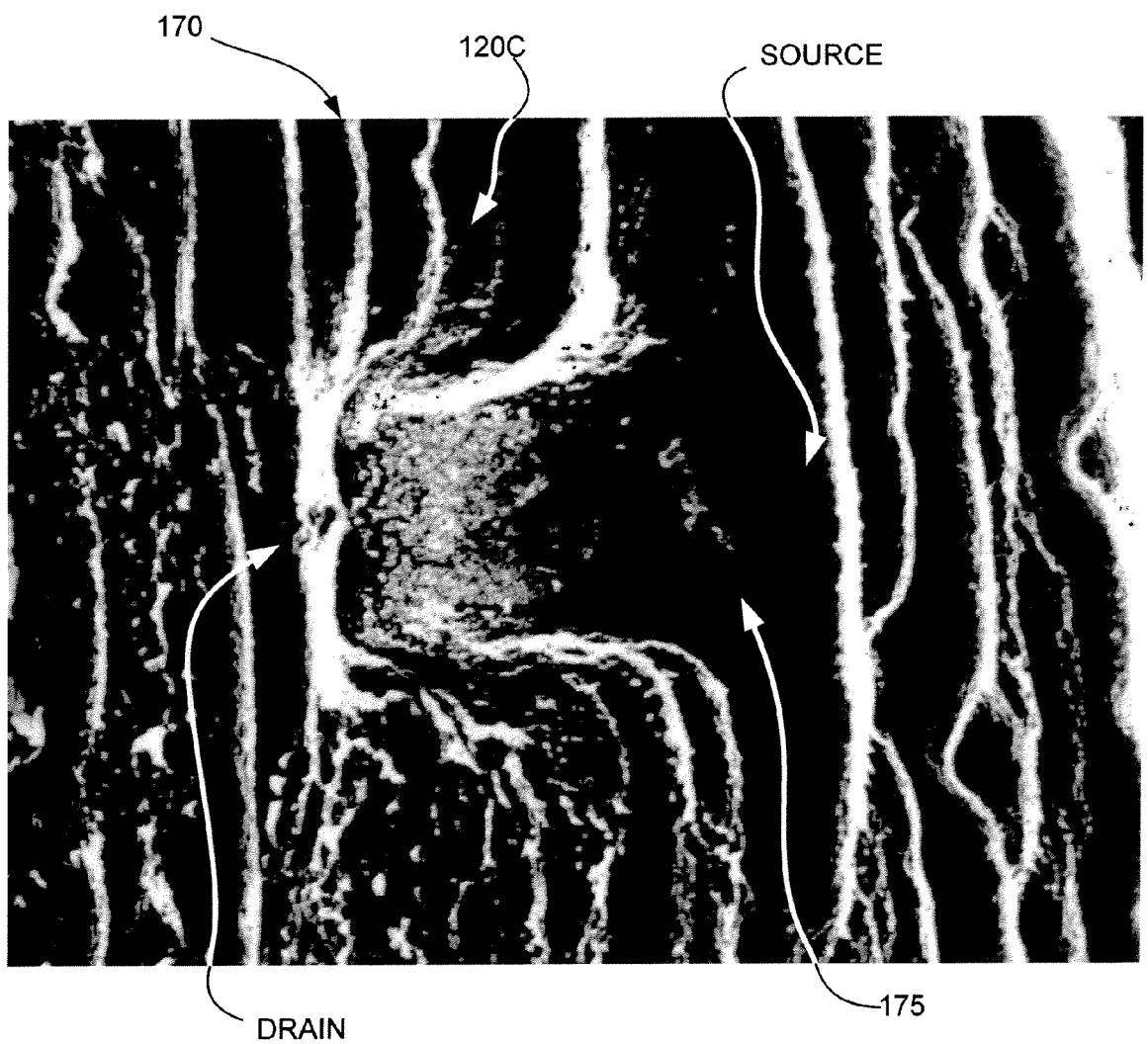
FIG. 9 is a photograph showing a transistor formed in accordance with another specific embodiment of the present invention.

The TFTs described above with reference to FIGS. 7C and 8 are intended to be exemplary of the uses for parallel lines formed in accordance with the vertical coffee-stain method of the present invention in the production of large-area electronic devices. Those skilled it the art will recognize that the parallel lines may be utilized to form other useful fine features and structures (e.g., long conductive lines) on the large-area electronic devices. Modifications to the described method may be utilized to produce hybrid structures, modifying the shape of the lines through controlled depinning of the liquid meniscus, which can be induced by depositing hydrophobic regions on the substrate, for example using wax printing or stamping features on the substrate. Such defects inhibit or interfere with the line formation, and can be utilized to generate intended structures. For example, FIG. 9 is a photograph showing a transistor 170 formed by placing a foreign object (gate metal) 175 on the substrate prior to the formation of self-organized lines 120C. Transistor 170 has three electrodes—gate, source and drain. The inventors use the pattern formation for source/drain electrodes as described above, but inherently also assemble the gate by placing gate metal 175 in the path of the coffee stain formation, whereby lines 120C are made to bend around gate metal 175 as indicated in the photograph. Moreover, the methods described herein may be beneficially utilized in other systems and arts (e.g., paintings) as well. For example, parallel lines produced in accordance with the present invention may be used to form fine capillaries and fluidic channels, and templates for small feature stamps without the use of photolithography.

Figure 10:
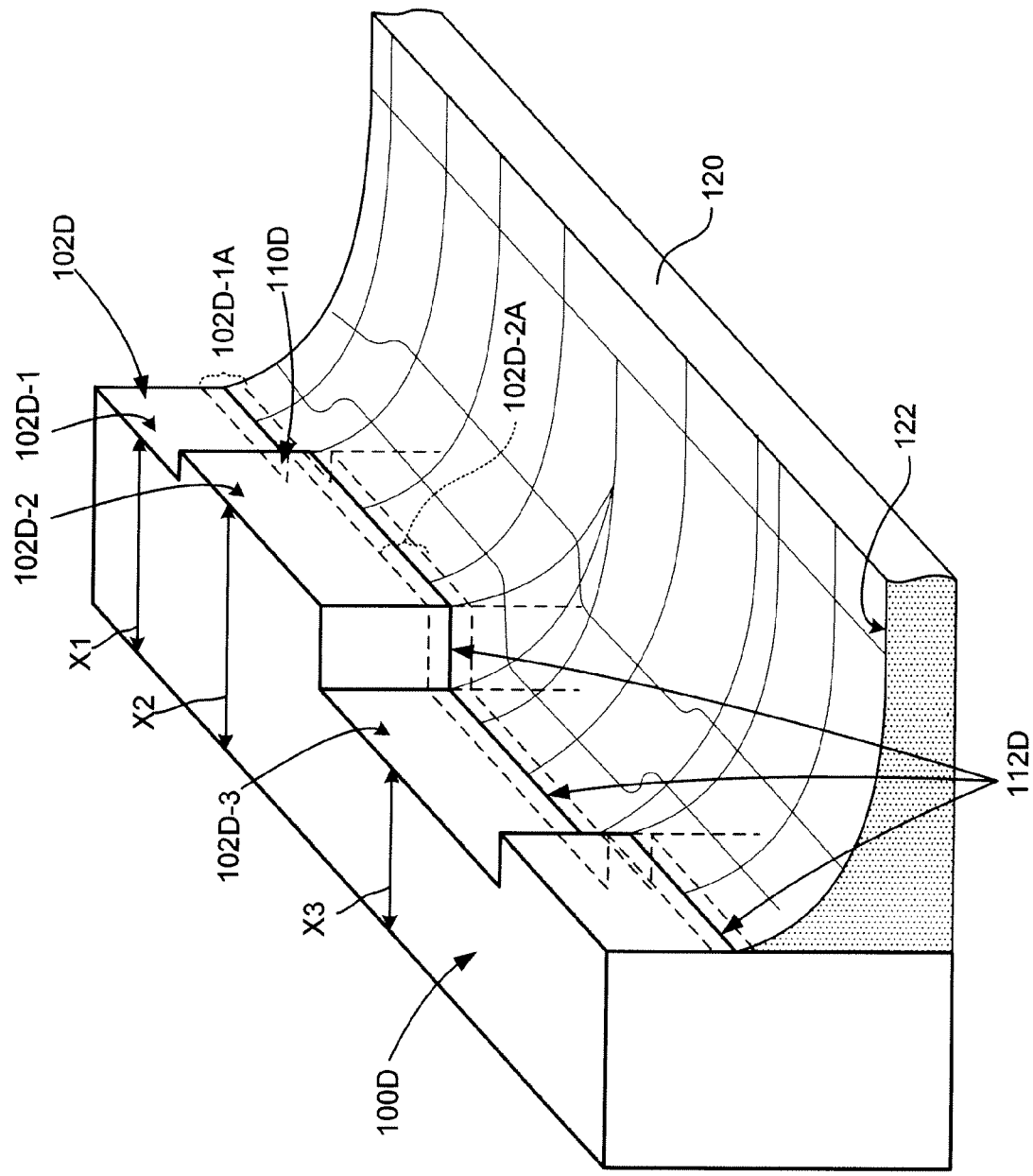
FIG. 10 is a top side partial perspective view showing an arrangement for forming self-organized lines on an irregular surface according to another embodiment of the present invention.
Figures 11A, 11B:
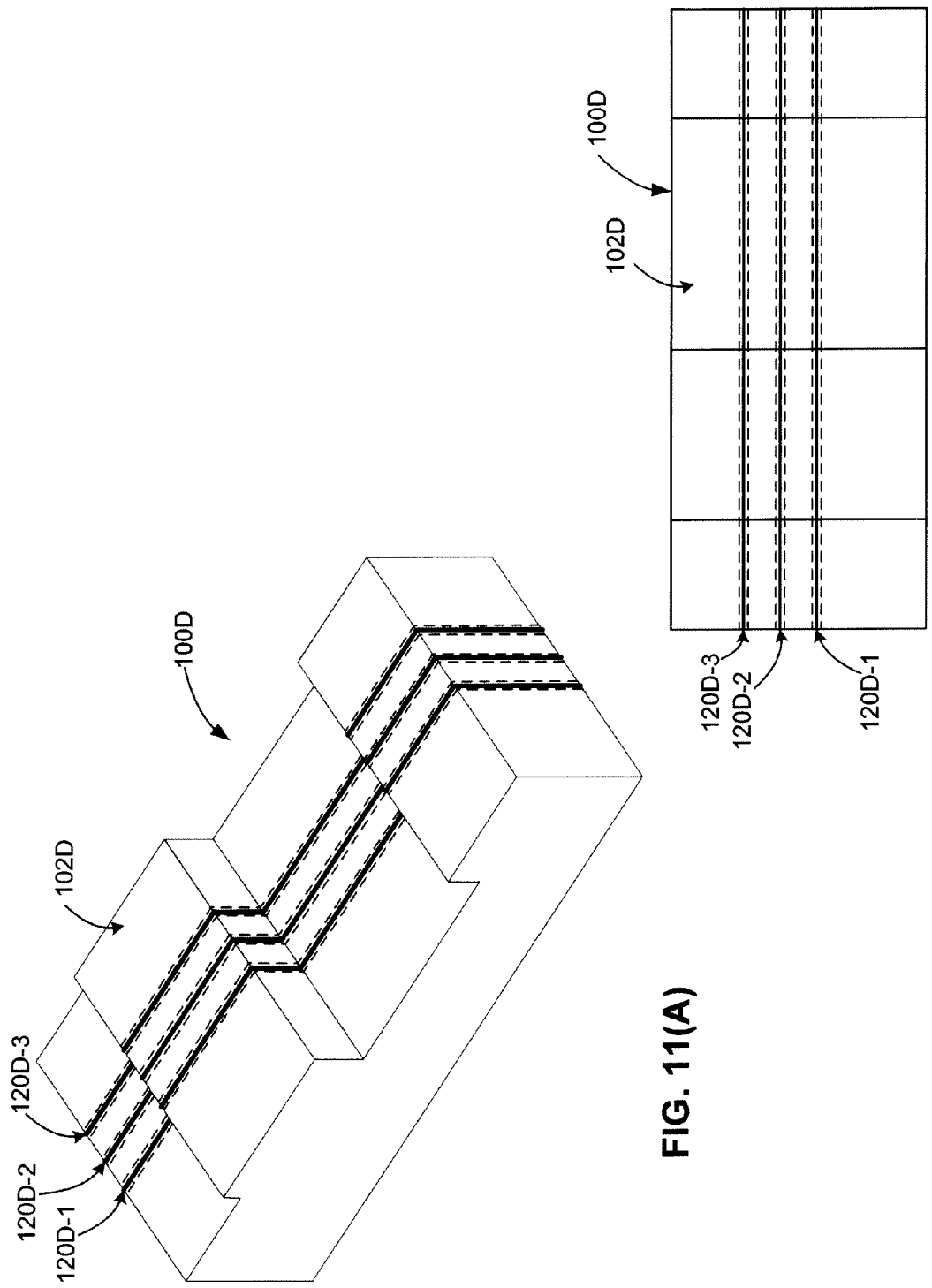
FIGS. 11(A) and 11(B) are a top side perspective and top plan views, respectively, showing parallel contiguous line structures disposed on a target structure having an irregular surface according to yet another embodiment of the present invention.

According to another aspect of the invention, the vertical coffee-stain method also facilitates the formation of line structures over irregular (e.g., non-planar) surfaces. Printing a silver conducting trace over a deep feature in a substrate can be difficult using jet printing or one of the other conventional techniques. As indicated in FIG. 10, target structure 100D includes an irregular surface 102D in which surface sections 102D-1, 102D-2 and 102D-3 have different thicknesses X1, X2 and X3, respectively. In accordance with the present invention, when target structure 100D is disposed (submerged) in solution 120, the liquid meniscus (i.e., waterline 112D) is formed by upper surface 115 follows the contours of substrate 100D (i.e., linear surface regions 102D-1A, 102D-2A, etc) as it passes over surfaces 102D-1, 102D-2, etc. As indicated in FIGS. 11(A) and 11(B), the result of repeated vertical coffee-stain processes is plural parallel contiguous line structures 120D-1, 120D-2 and 120D-3 that form over the non-parallel sections of substrate 100D, but trace a straight-line path across surface 102D from a top-view perspective (as indicated in FIG. 11(B)). Such contiguous line structures are inherently formed using the method of the present invention due to the tendency for the waterline to follow the changing topography when a target structure is tipped on its side and submerged in the solution. This feature may be very useful in the formation of long signal lines disposed over multiple metallization and passivation layers of a large-area electronic device.

Although the present invention has been described with respect to certain specific embodiments, it will be clear to those skilled in the art that the inventive features of the present invention are applicable to other embodiments as well, all of which are intended to fall within the scope of the present invention. For example, the target structure described herein may comprise two substrates pressed together to facilitate simultaneous vertical coffee-stain line formation on both substrates. In addition, the process described herein with respect to forming lines on a single substrate may be repeated in parallel (e.g., simultaneously forming lines on multiple substrates disposed in a single bath) to increase productivity. The lines produced by the vertical coffee-stain method of the present invention are not limited to metal lines unless otherwise specified in the claims. Further, the vertical coffee-stain method may be utilized to form structures other than large-area electronic devices, such as in the production of masks that are used for subsequent semiconductor processing steps (e.g., etch, implant, etc.).

The invention claimed is:

1. A method for forming a first self-organized line on a target structure such that the line is disposed on a first linear surface region of the target structure, the method comprising:
    disposing the target structure in operable contact with a solution including a solute disposed in a liquid solvent, wherein the solute consists of particles having an average size that is smaller than one micron, and wherein the solvent comprises liquid molecules having a stronger attraction to a surface of the target structure than to themselves, whereby an upper surface of the solution forms an upward curving waterline on the first linear surface region of the target structure; and
    causing the solvent to evaporate at a rate such that the upward curving waterline recedes downward along the first linear surface region of the target structure, and such that said solute forms said first self-organized line above the receding waterline on the first linear surface region.

2. The method according to claim 1, wherein the solution comprises silver nanoparticles disposed in de-ionized water.

3. The method according to claim 1, wherein the target structure comprises a substrate, and wherein disposing the target structure in said solution comprises submerging an edge of the substrate in the solution.

4. The method according to claim 3, wherein said submerging comprises inserting said edge in a puddle of said solution disposed on a bath plate.

5. The method according to claim 3, wherein said submerging comprises inserting said edge in a pool of said solution disposed in a container.

6. The method according to claim 3, further comprising displacing said substrate relative to the upper surface of said solution after formation of said first self-organized line such that said waterline is displaced from said first linear surface region to a second linear surface region of said substrate.

7. The method according to claim 6, further comprising forming a second self-organized line on the second linear surface region of said substrate by causing the solvent to evaporate at said rate such that the upward curving waterline recedes downward along the second linear surface region, and such that said solute forms said second self-organized line above the receding waterline on the second linear surface region.

8. The method according to claim 3, further comprising forming a second self-organized line that is parallel to the first self-organized line on a second linear surface region of said substrate by allowing said waterline to slip from the first linear surface region to the second linear surface region, and then causing the solvent to evaporate at the rate such that the waterline recedes downward along the second linear surface region, and such that said solute forms said second self-organized line above the receding waterline on the second linear surface region.

9. The method according to claim 1, wherein causing the solvent to evaporate comprises altering one of a temperature and an air pressure surrounding said target structure and said solution.

10. The method according to claim 1, wherein said surface of said target structure comprises a plurality of non-parallel sections, and wherein forming said first self-organized line comprises forming a contiguous line structure extending over said plurality of non-parallel sections.

11. A method for forming a plurality of parallel self-organized lines on a target structure, the method comprising:
    disposing the target structure in operable contact with a solution including a solute disposed in a liquid solvent, wherein the solute consists of particles having an average size that is smaller than one micron, and wherein the solvent comprises liquid molecules having a stronger attraction to a surface of the target structure than to themselves, whereby an upper surface of the solution forms an upward curving waterline on a first linear surface region of the target structure;

causing the solvent to evaporate at a rate such that the upward curving waterline recedes downward along the first linear surface region of the target structure, and such that said solute forms a first self-organized line above the receding waterline on the first linear surface region;

displacing an upper surface of the solution relative to the target structure such that the upward curving waterline is disposed on a second linear surface region of the target structure; and causing the solvent to evaporate at a rate such that the upward curving waterline recedes downward along the second linear surface region of the target structure, and such that said solute forms a second self-organized line above the receding waterline on the second linear surface region.

12. The method according to claim 11, wherein displacing the upper surface of the solution comprises displacing said target structure relative to the solution after formation of said first self-organized line such that said waterline is displaced from said first linear surface region to said second linear surface region.

13. The method according to claim 11, wherein displacing the upper surface of the solution comprises allowing said waterline to slip from the first linear surface region to the second linear surface region.

14. A method for forming a large-area electronic device comprising:

disposing a substrate in operable contact with a solution including metal nanoparticles disposed in a liquid solvent, wherein the solvent comprises liquid molecules having a stronger attraction to a surface of the substrate than to themselves, whereby an upper surface of the solution forms an upward curving waterline on a first linear surface region of the substrate; and causing the solvent to evaporate at a rate such that the upward curving waterline recedes downward along the first linear surface region of the substrate, and such that said metal nanoparticles form a first self-organized line above the receding waterline on the first linear surface region.

15. The method according to claim 14, further comprising sintering the first self-organized line.

16. The method according to claim 14, further comprising:

displacing the upper surface of the solution relative to the substrate such that the upward curving waterline is disposed on a second linear surface region of the substrate; and causing the solvent to evaporate at the rate such that the upward curving waterline recedes downward along the second linear surface region of the substrate, and such that said metal nanoparticles form a second self-organized line above the receding waterline on the second linear surface region.

17. The method according to claim 16, further comprising:

printing source and drain electrodes onto opposing first and second ends of the first and second self-organized lines; and removing portions of the first and second self-organized lines such that the first self-organized line is connected only to the source electrode, and the second self-organized line is connected only to the drain electrode, thereby forming an interdigitated thin-film transistor on said substrate.

18. The method according to claim 17, wherein removing portions of the first and second self-organized lines comprises laser ablating said portions.

19. The method according to claim 16, further comprising:

printing source and drain electrodes on opposing sides of the first and second self-organized lines; and forming a gate dielectric over said source and drain electrodes and said first and second self-organized lines, thereby forming a grid thin-film transistor on said substrate.

20. The method according to claim 16, further comprising disposing a gate metal on said substrate prior to forming said first and second self-organized lines such that said gate metal is disposed on said first and second linear surface regions.

* * * * *